United States Patent
Barthelmess et al.

(10) Patent No.: US 7,667,297 B2
(45) Date of Patent: Feb. 23, 2010

(54) METHOD FOR PRODUCING A STOP ZONE IN A SEMICONDUCTOR BODY AND SEMICONDUCTOR COMPONENT HAVING A STOP ZONE

(75) Inventors: Reiner Barthelmess, Soest (DE); Anton Mauder, Kolbermoor (DE); Franz Josef Niedernostheide, Muenster (DE); Hans-Joachim Schulze, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 160 days.

(21) Appl. No.: 11/423,026

(22) Filed: Jun. 8, 2006

(65) Prior Publication Data

US 2006/0286753 A1    Dec. 21, 2006

(30) Foreign Application Priority Data

Jun. 8, 2005    (DE) ................... 10 2005 026 408

(51) Int. Cl.
*H01L 29/167* (2006.01)
*H01L 29/30* (2006.01)

(52) U.S. Cl. ................... 257/607; 257/617

(58) Field of Classification Search ................ 257/376, 257/399, 400, 607, 617, E29.037, E29.197, 257/E29.198, E29.211, E29.382, E29.383, 257/E29.388
See application file for complete search history.

(56) References Cited

U.S. PATENT DOCUMENTS

| | | | |
|---|---|---|---|
| 4,332,627 A * | 6/1982 | Schmitt et al. ............. 438/527 |
| 4,517,582 A | 5/1985 | Sittig ............................ 357/38 |
| 5,075,751 A | 12/1991 | Tomii et al. .................... 357/38 |
| 6,198,115 B1 * | 3/2001 | Francis et al. ................ 257/144 |
| 6,229,196 B1 * | 5/2001 | Shishido et al. ............. 257/617 |
| 2005/0280076 A1 | 12/2005 | Barthelmess et al. ........ 257/327 |

FOREIGN PATENT DOCUMENTS

| | | |
|---|---|---|
| DE | 10048165 A1 | 9/2000 |
| DE | 10243758 A1 | 9/2002 |
| JP | 02-196471 A | 8/1990 |
| JP | 07-050406 A | 2/1995 |
| JP | 2002-305305 A | 10/2002 |
| JP | 2003-152198 A | 5/2003 |

* cited by examiner

*Primary Examiner*—Hung Vu
(74) *Attorney, Agent, or Firm*—Coats & Bennett, P.L.L.C.

(57) ABSTRACT

A method for producing a buried stop zone in a semiconductor body and a semiconductor component having a stop zone, has the method steps of:
 providing a semiconductor body having a first and a second side and a basic doping of a first conduction type,
 irradiating the semiconductor body via one of the sides with protons, as a result of which protons are introduced into a first region of the semiconductor body situated at a distance from the irradiation side,
 carrying out a thermal process in which the semiconductor body is heated to a predetermined temperature for a predetermined time duration, the temperature and the duration being chosen such that hydrogen-induced donors are generated both in the first region and in a second region adjacent to the first region in the direction of the irradiation side.

8 Claims, 4 Drawing Sheets

Protonenverteilung (Reichweite +/- Standardabweichung) abhängig von der Teilchenenergie

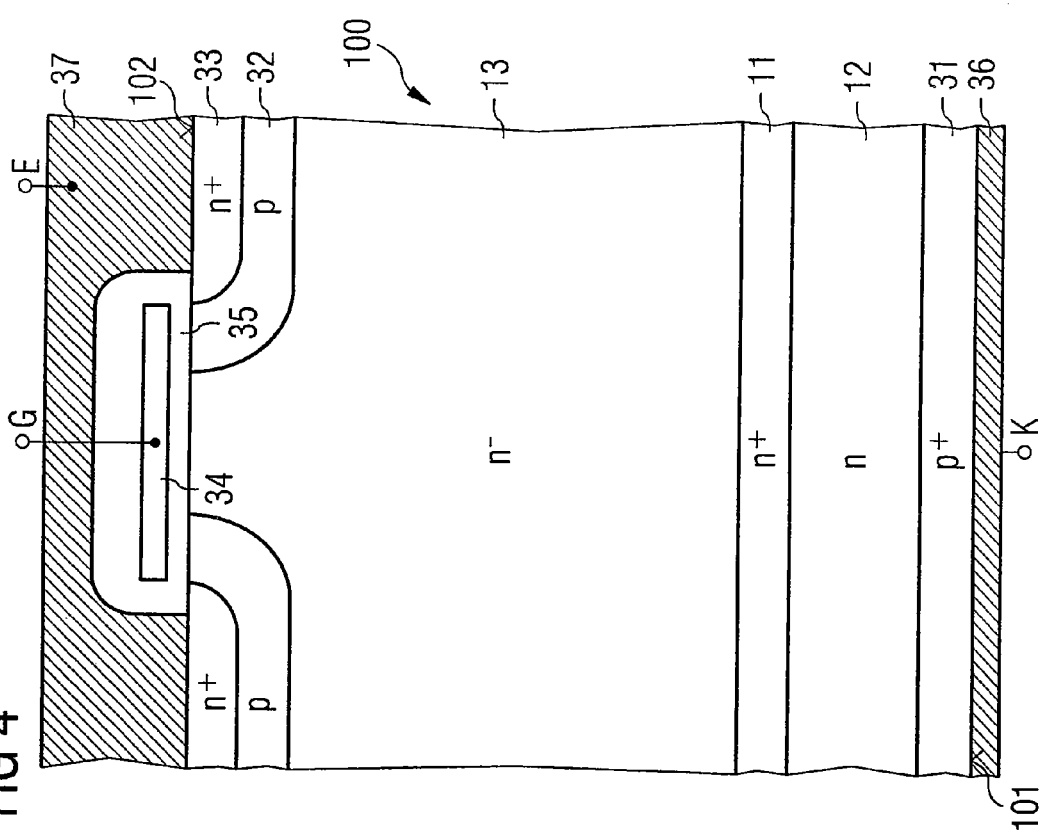
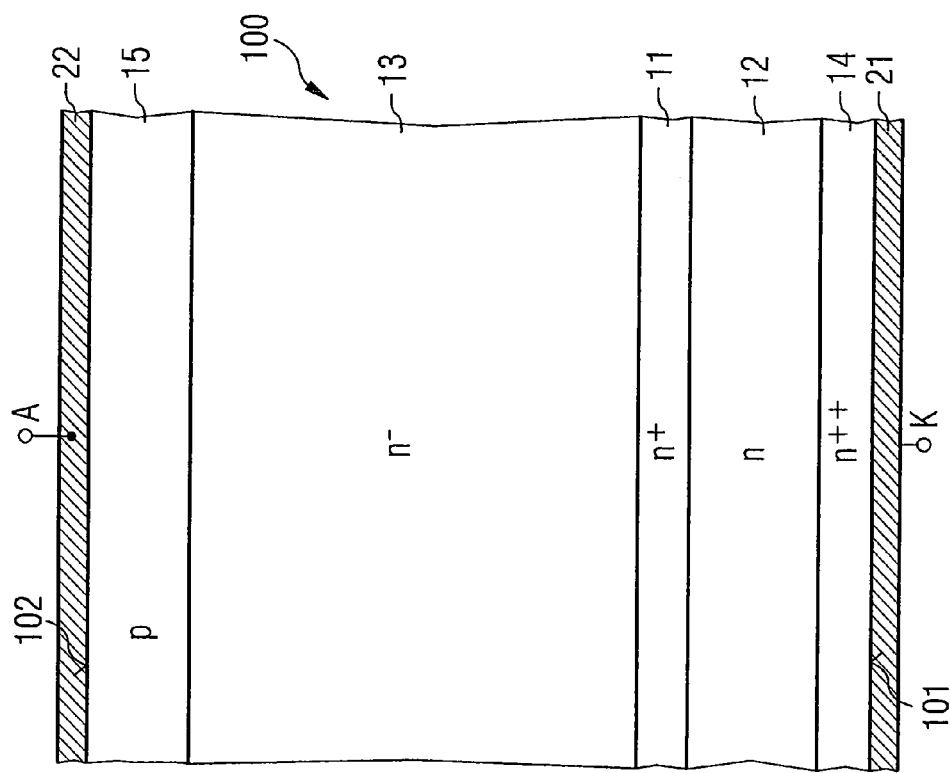

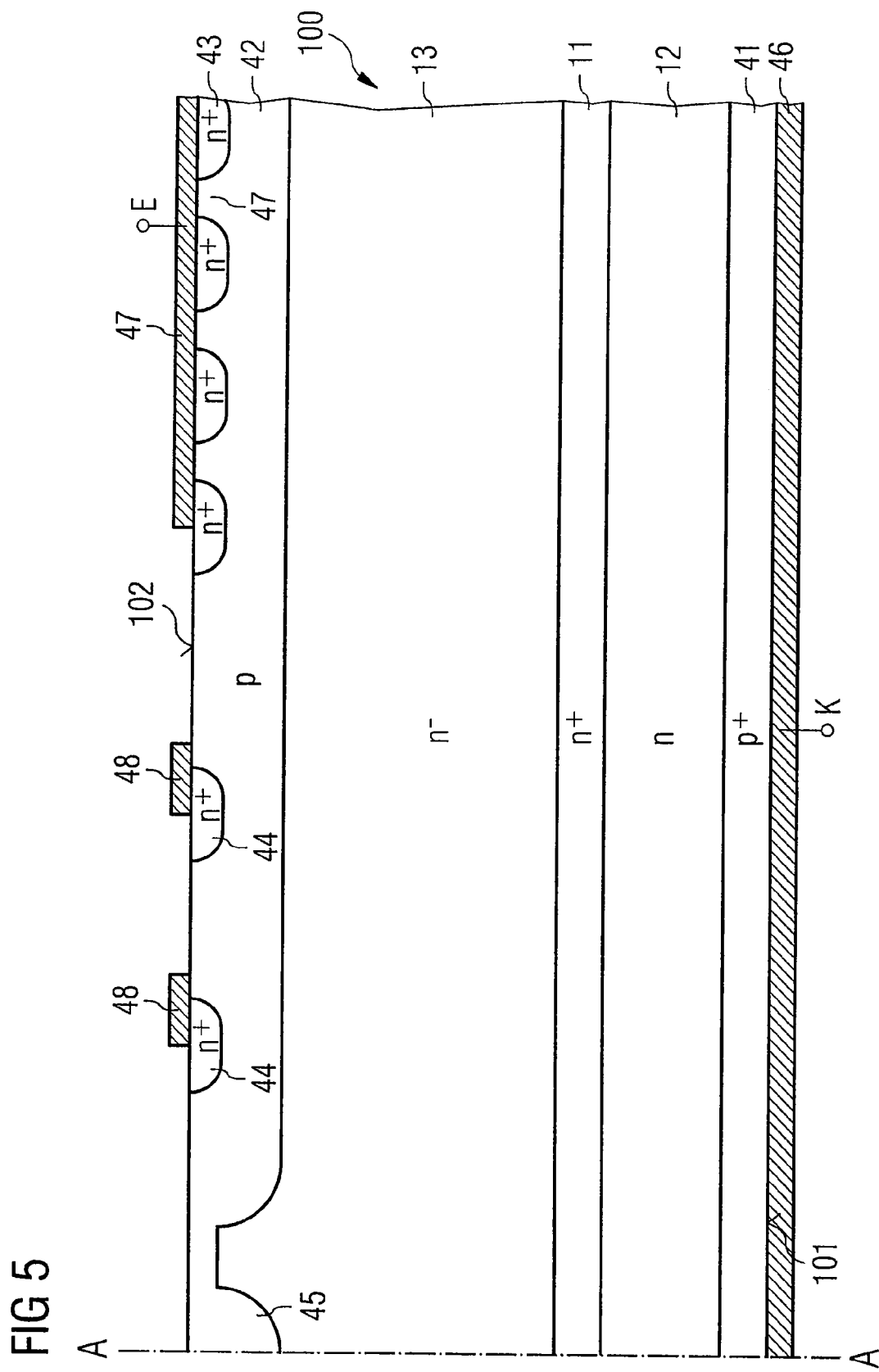

METHOD FOR PRODUCING A STOP ZONE IN A SEMICONDUCTOR BODY AND SEMICONDUCTOR COMPONENT HAVING A STOP ZONE

PRIORITY

This application claims priority from German Patent Application No. 10 2005 026 408.5, which was filed on Jun. 8, 2005, and is incorporated herein by reference in its entirety.

TECHNICAL FIELD

The invention relates to a method for producing a stop zone or field stop zone in a semiconductor body and to a semiconductor component having a stop zone.

BACKGROUND

It is known, in the case of bipolar power components, such as, for example, power diodes, power thyristors or power IGBTs, which have a comparatively weakly doped base zone, to provide in the base zone a stop zone doped more highly than the base zone. The stop zone serves, when the component is in the off state, for limiting the electric field propagating in the base zone and prevents a punch-through of the electric field to a more heavily doped emitter zone adjacent to the base zone. A power component having such a stop zone is described for example in DE 100 48 165 A1.

U.S. Pat. No. 4,517,582 describes a vertical power component having a stop zone arranged in a base zone at a distance from an emitter zone. Arranged between the stop zone and the emitter zone is an intermediate zone, in which the doping concentration decreases proceeding from the stop zone in the direction of the emitter zone down to the level of the doping concentration of the base zone.

A method for producing an n-doped stop zone in a semiconductor body is described in DE 102 43 758 A1. This method involves radiating protons into the region of the semiconductor body in which the stop zone is intended to be produced. This irradiation step is followed by a thermal method in which the semiconductor body is heated to temperatures of between 250° C. and 550° C. for a time duration of between 1 minute and 250 minutes in order to generate hydrogen-induced donors.

When bipolar power components are turned off, it is advantageous, in principle, if the temporal gradient of the current flowing in the base zone is as small as possible toward the end of the turn-off phase, that is to say if the current flowing in the base zone decreases as gently as possible. Voltages which are induced during the turn-off operation in supply leads to the component at parasitic leakage inductances that are unavoidably present can thereby be minimized.

SUMMARY

The method for producing a buried stop zone may comprise the steps of: providing a semiconductor body having a basic doping of a first conduction type and having a first and a second side, and irradiating the semiconductor body via one of the sides with protons, as a result of which protons are introduced into a first region of the semiconductor body situated at a distance from the irradiation side. A thermal process can subsequently be carried out in which the semiconductor body is heated to a predetermined temperature for a predetermined time duration. In this case, the temperature and the time duration of the thermal process, which is also referred to hereinafter as an annealing process, can be chosen such that hydrogen-induced donors are generated both in the first region and in a second region adjacent to the first region in the direction of the irradiation side.

The temperature during the thermal process can be between 200° C. and 550° C. given a time duration of between two hours and 20 hours. The time duration of the thermal process can be preferably 2.5 hours and 12 hours, and the temperature can be preferably between 400° C. and 500° C.

The distance between the first region of the semiconductor body, in which the protons are introduced, and the irradiation side can be dependent on the irradiation energy with which the protons are introduced. The distance between the region and the irradiation side, which corresponds to the depth of the later stop zone proceeding from this side, can be between approximately 5% and approximately 40%, preferably between 10% and 15%, of the total thickness of the semiconductor body. In this case, the thickness of the semiconductor body influences the dielectric strength, that is to say the permissible reverse voltage of the component. With silicon as material of the semiconductor body, the thickness can be between approximately 6 µm and approximately 20 µm, preferably approximately 11 µm, per 100 V of desired reverse voltage. For an exemplary component having a blocking capability of 13 kV, a typical thickness can thus be approximately 1500 µm and a typical penetration depth of the field stop can be approximately 150-250 µm.

The protons leave irradiation defects in the semiconductor body on their way from the irradiation side into the first region.

During the annealing process, the protons diffuse from the first region, so that hydrogen-induced donors, the formation of which requires the defects caused by irradiation, on the one hand, and hydrogen, on the other hand, are also generated in the second region situated between the irradiation side and the first region. In this case, the doping concentration of the hydrogen-induced donors in the second region can be dependent on the proton concentration achieved by the diffusion of protons from the first region in the direction of the irradiation side. The donor concentration in the second region resulting from the diffusion of the protons and the interaction thereof with the defects can usually be significantly lower than the donor concentration achieved by the irradiation or implantation method in the first region.

The proton concentration in the second region can be dependent, in particular, on the duration of the annealing process and also on the temperature employed during the annealing process. Whereas at annealing temperatures of 400° C. or higher a time duration in the region of two hours may already suffice to achieve an appreciable doping concentration in the second region, correspondingly longer annealing durations may have to be employed at lower annealing temperatures or large implantation energies which may lead to a large vertical extent of the second region. No proton-induced increase in the basic doping may occur in the region of the semiconductor body which is adjacent to the first region on the side facing the second side, since no defects caused by irradiation are present here and an essential constituent which can be responsible for donor formation is thus lacking.

The method may make it possible to produce a two-stage field stop zone which is more heavily doped in the first region than in the second region and in which the doping concentration in both regions is higher than the basic doping of the semiconductor body. In a finished power component having such a stop zone, an emitter zone can be adjacent to the more weakly doped second region of the stop zone, which emitter zone may be n-doped or p-doped depending on the component. The second region of the stop zone, the second region being adjacent to said emitter zone and doped more highly than the basic doping of the semiconductor body, may form a "plasma reservoir" of charge carriers during the turn-off operation of such a power component, so that throughout the entire turn-off operation sufficient charge carriers are available to keep the current gradient sufficiently low even in the end phase of the turn-off operation. For this purpose, the more weakly doped second region may have a sufficient vertical extent. The extent can be typically between 4% and approximately 35%, preferably between 8% and 14%, of the total thickness of the semiconductor body.

BRIEF DESCRIPTION OF THE DRAWINGS

The present invention is explained in more detail below with reference to figures.

FIG. 3 schematically shows a cross section through a power diode having a stop zone.

FIG. 4 schematically shows a cross section through an IGBT having a stop zone.

FIG. 5 schematically shows a cross section through a power thyristor having a stop zone.

In the figures, unless specified otherwise, identical reference symbols designate identical component regions with the same meaning.

DETAILED DESCRIPTION

The method for producing a two-stage field stop zone is explained below with reference to FIGS. 1a and 1b.

Figure 1A:
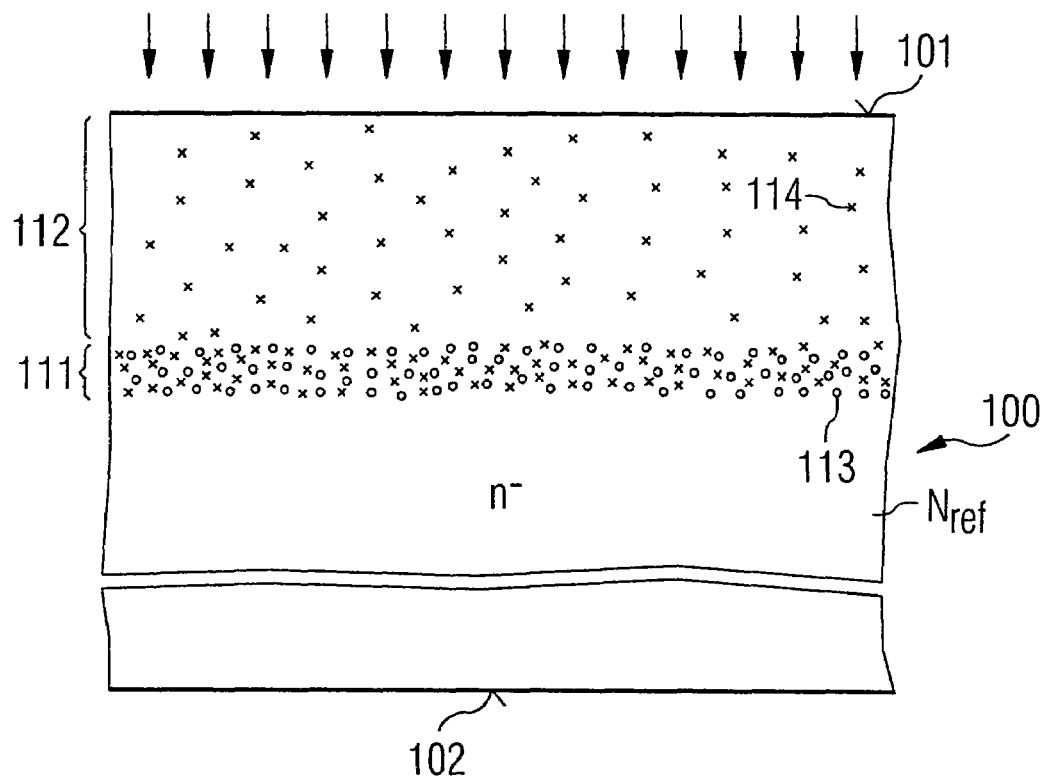
FIGS. 1a-b illustrate a method for producing a two-stage stop zone in a semiconductor body.

Referring to FIG. 1a a semiconductor body 100 is provided, which comprises silicon, for example, and which has a basic doping. The semiconductor body 100 has a first side 101 and a second side 102 and is irradiated with protons via one of the two sides, the first side 101 in the example. During the irradiation step, the protons are introduced in to a first region of the semiconductor body 100 arranged at a distance from the irradiation side 101. A distance between said first region 111 and the irradiation side 101 is dependent on the irradiation energy with which the proton irradiation is effected. The dimensions of said first region 111 in the vertical direction are also dependent on the irradiation energy. It holds true in this case that the dimensions of said first region 111 in the vertical direction are all the larger the higher the irradiation energy, that is to say the further the protons penetrate into the semiconductor body 100. The maximum of the proton concentration in the first region 111 lies approximately in the center of said region 111 in the vertical direction after the conclusion of the irradiation step.

Figure 6:
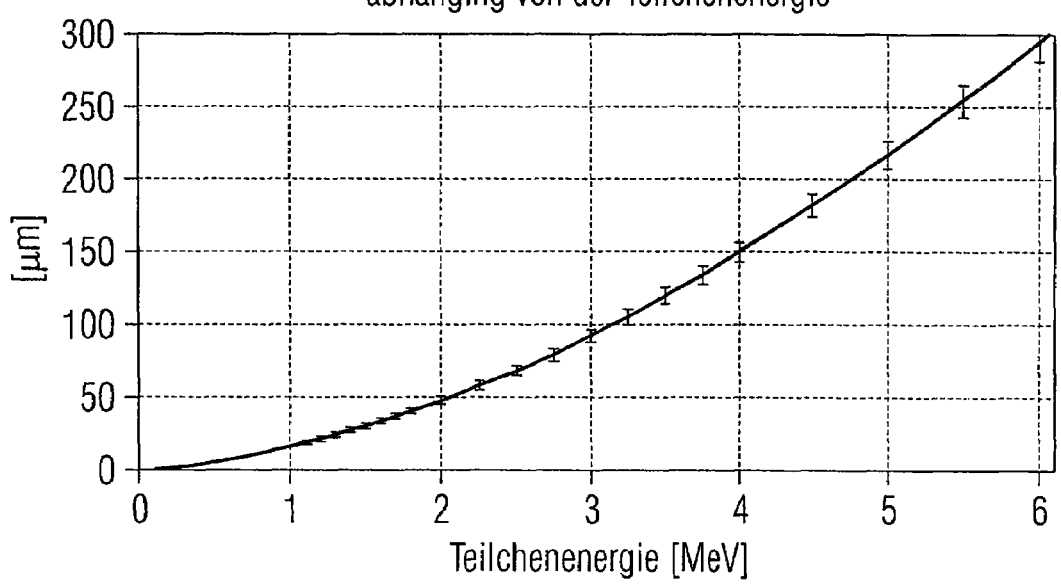
FIG. 6 shows, for a semiconductor body, the dependence of the distance between the irradiation side of a first region having protons and the standard deviation of the depth distribution on the particle energy with silicon as semiconductor material.

In FIG. 6, the penetration depth (in μm) of the protons proceeding from the irradiation side 101 is plotted as a function of the irradiation energy (in MeV) with the use of silicon as semiconductor material. The standard deviation of the penetration depth is plotted in a conventional manner in FIG. 6 by means of vertical lines above respective values of the irradiation energy. As can be seen from the curve, penetration depths of the protons of up to 300 μm can be achieved at irradiation energies of approximately 6 MeV. The penetration depths for lower irradiation energies are correspondingly smaller.

In a second region 112 of the semiconductor body 100 situated between the irradiation side 101 and the first region 111, the protons leave irradiation defects in the crystal lattice of the semiconductor body. These defects are schematically represented as crosses in FIG. 1a and designated by the reference symbol 114. Protons introduced into the crystal lattice in the first region 111 are schematically represented by circles and designated by the reference symbol 113. Irradiation defects are also present, of course, in the first region 111, as far as which the protons advance. In this region the concentration of irradiation defects is higher than the concentration of protons introduced.

The irradiation step is followed by a thermal process or annealing process in which the semiconductor body 100 is heated to a temperature of between 200° C. and 550° C., preferably between 400° C. and 500° C., for a time duration of between two hours and 20 hours, preferably between 2.5 hours and 12 hours. During this thermal process lasting 2 hours or longer, preferably 2.5 hours or longer, protons from the first region 111 outdiffuse from said first region 111 to an appreciable extent. Furthermore, during the annealing process, in the first region 111, hydrogen-induced donors are formed by the protons introduced during the irradiation process. During the annealing process, the protons diffusing in the direction of the irradiation side 101 likewise lead to the generation of hydrogen-induced donors in the second region 112 arranged between the first region 111 and the irradiation side 101, in which case the protons diffusing from the first region in the direction of the irradiation side 101 and the irradiation defects brought about by the previous proton irradiation in the second region participate in this generation of hydrogen-induced donors in the second region 112. During the thermal step, protons from the first region 111 also outdiffuse in the direction of the side 102 opposite to the irradiation side. However, no hydrogen-induced donors arise in the region of the semiconductor body adjacent to the first semiconductor region 111 in this direction, since no irradiation defects necessary for the formation of such donors are present there.

Figure 1B:
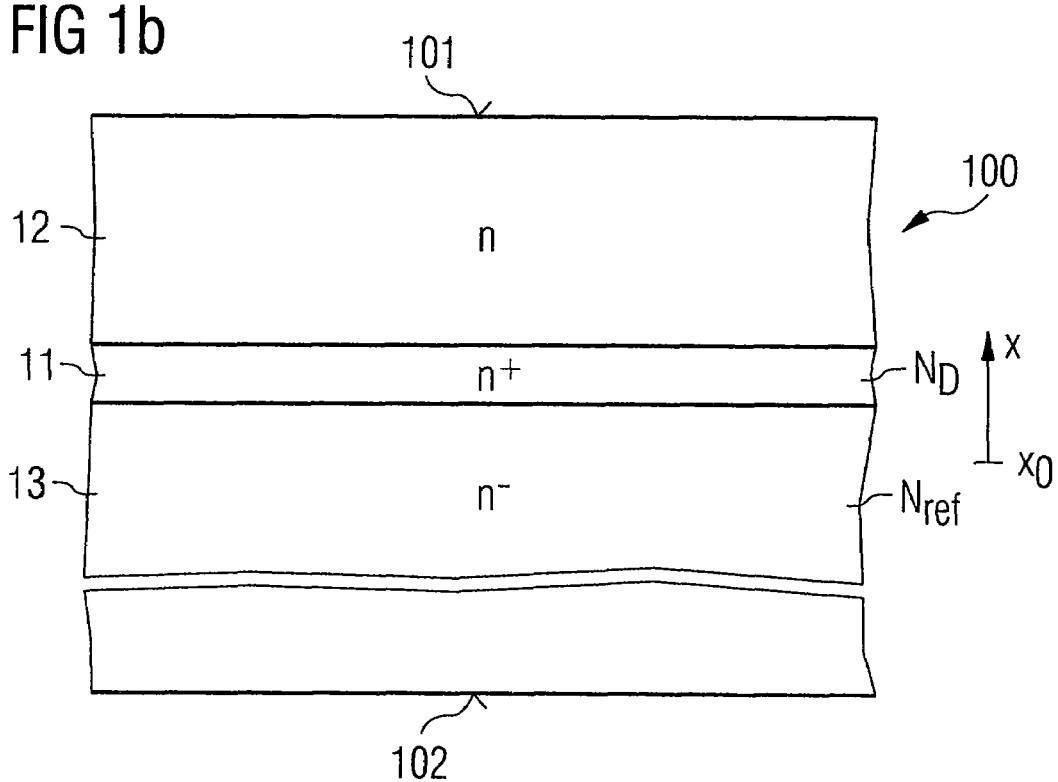

FIG. 1b shows the semiconductor body 100 after the conclusion of the annealing process. In this case, the reference symbol 11 designates a highly doped n-doped first semiconductor zone arranged in the first region 111 of the semiconductor body 100. The reference symbol 12 designates a second semiconductor zone 12, which is doped more weakly than the first zone 11 and is arranged in the second region 112 of the semiconductor body 100.

Figure 2:
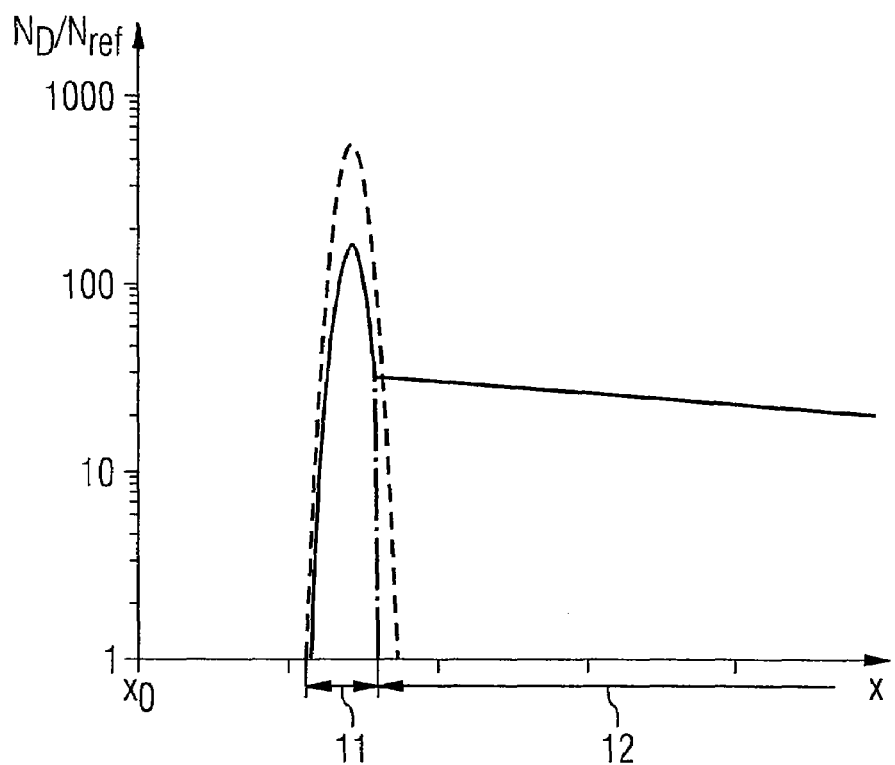
FIG. 2 illustrates the doping profile in the semiconductor body in FIG. 1 after the conclusion of the method.

FIG. 2 shows by way of example the doping profile in the vertical direction of the semiconductor body 100. In the example the doping profile is plotted proceeding from a vertical position $x_0$, at which the semiconductor body 100 has its basic doping, in the direction of the irradiation side 101. The basic doping of the semiconductor body 100 is designated hereinafter by $N_{ref}$, while $N_D$ designates the doping concentration in the first and second semiconductor zones 11, 12. FIG. 2 plots the doping concentration $N_D$ in the first and second semiconductor zones 11, 12 in relation to the basic doping $N_{ref}$. The doping concentration has in the first semiconductor zone 11, proceeding from the semiconductor region 13 having the basic doping, an approximately parabolic profile with a maximum doping concentration lying approximately in the center of the first semiconductor zone 11 in the vertical direction. On account of the diffusion of protons in the direction of the irradiation side 101 which has taken place during the long annealing process, the doping concentration in the second semiconductor zone 12 decreases linearly in the example proceeding from the first semiconductor zone 11 in the direction of the irradiation side 101. In the case of very long annealing durations, however, it is possible to achieve a doping profile in the second semiconductor zone 12 in the case of which the doping concentration is approximately constant everywhere in the second semiconductor zone 12 or even rises again in the vicinity of the front side 101.

The doping concentration in the second semiconductor zone 12 is significantly lower than the maximum doping concentration in the first semiconductor zone 11. In the case of the doping profile illustrated in FIG. 2, said doping concentration in the second semiconductor zone 12 is less than 20% of the maximum doping concentration in the first semiconductor zone 11. However, the doping concentration in the second semiconductor zone 12 is significantly higher than the basic doping and amounts to approximately 20 times the basic doping in the example.

The method as explained above is suitable for producing two-stage stop zones in arbitrary bipolar vertical power components which is explained below with reference to FIGS. 3 to 5.

FIG. 3 shows a semiconductor component formed as a power diode. The diode is integrated in a semiconductor body 100 and has an n-doped base zone 13, the doping concentration of which corresponds to a basic doping of the semiconductor body 100. Adjacent to said base zone 13 is the heavily n-doped first semiconductor zone 11, which forms a stop zone or a first stop zone section. The second semiconductor zone 12, which is doped more weakly than the first semiconductor zone 11 and is adjacent to the first semiconductor zone 11, forms an intermediate zone or a second stop zone section 12. Said second stop zone section 12 is arranged between a first side 101 and the first stop zone section 11 of the semiconductor body. The semiconductor body 11 has a very heavily n-doped semiconductor section 14, which forms the n-type emitter of the power diode, in the region of said first side 101. The donor concentration in said semiconductor section 14 forming the n-type emitter is considerably higher than in the first semiconductor zone 11 forming the first stop zone section. The n-type emitter 14 is contact-connected by a first metallization 21, which forms a cathode K of the power diode.

In the region of a side of the semiconductor body 100 opposite to the first side 101, the semiconductor body 100 has a p-doped semiconductor section 15, which forms the p-type emitter of the power diode and which is contact-connected by a second metallization 22. Said second metallization forms the anode A of the power diode.

When the component is in the off state, that is to say when a negative voltage is present between anode A and cathode K, and when an electric field propagates in the base 13 proceeding from the p-type base 15, the more heavily doped first stop zone section 11 has the effect, in a known manner, that said electric field may punch through to the n-type emitter 14 and, preferably in the case of diodes and necessarily in the case of IGBTs or thyristors, already ends in the region of the second stop zone section 12.

The advantages of the second stop zone section 12 that is doped more heavily than the n-type base 13 but more weakly than the first stop zone section 11 are afforded when the component previously operated in the on state is turned off, as is explained below. In order to drive the power diode in the on state, a positive voltage is applied between anode A and cathode K. If said voltage is lowered to a negative value, then the diode is commutated into off-state operation. During the on state, a charge carrier plasma is present in the base 13 and in the first and second stop zone sections 11, 12, said plasma being reduced firstly in the base zone 13 during the turn-off operation. The second stop zone section 12, which is doped more highly than the base zone 13, has the effect that even toward the end of the turn-off operation, before the n-type emitter 14, a sufficiently large plasma reservoir is present in order to keep the gradient of the current flow through the diode sufficiently small even in the end phase of the turn-off operation and thereby to obtain a gentle turn-off behavior of the power diode.

What is essential for such a gentle turn-off behavior is that the doping concentration is higher in the second stop zone section 12 than in the base zone, said doping concentration preferably being more than twice as high, ideally more than ten times as high, as the doping concentration of the base zone. Furthermore, the doping concentration in the second stop zone section 12 must be lower than the doping concentration in the first stop zone section 11. In this case, the doping concentration of the second stop zone section 12 is more than 5% of the maximum doping concentration in the first stop zone section 11, but is less than 50% of the maximum doping concentration in the first stop zone section 11.

FIG. 4 illustrates the application of a two-stage stop zone with a more heavily doped stop zone section 11 and a stop zone section 12, which is doped more weakly than the first stop zone section but more heavily than a base zone 13, to an IGBT. In the case of this IGBT, the reference symbol 31 designates a p-type emitter arranged in the region of the first side 101 of the semiconductor body 100, said p-type emitter being contact-connected by a first metallization 36, which is referred to hereinafter as the cathode. As has already been the case with the diode in FIG. 3, the reference symbol 13 designates the n-type base of the IGBT.

In the region of a second side 102 of the semiconductor body 100, which side forms the so-called front side in the example, there is a cell array comprising a plurality of p-type base zones 32 in each of which n-type emitter zones 33 are arranged. In order to form conducting channels in the p-type base zones 32 between the n-type emitter zones 33 and the n-type base 13, a gate electrode 34 is present, which is arranged in a manner insulated from the semiconductor body 100 by means of a gate insulation layer 35. The n-type emitter zones 33 are contact-connected by a second metallization 37, which forms the emitter electrode of the IGBT, in a manner that is known in principle.

Referring to FIG. 5, the concept of a two-stage field stop zone can also be applied to a power thyristor. In FIG. 5, the reference symbol 13 designates the n-type base of said thyristor, and, as has already been the case for the components of FIGS. 3 and 4, the reference symbols 11 and 12 designate the first and second stop zone sections of the two-stage stop zone. In the region of the first side 101 of the semiconductor body 100, which first side forms the rear side of the thyristor in the example, there is a p-doped semiconductor zone 41 present, which forms the p-type emitter and which is contact-connected by a metallization 46, which is referred to hereinafter as the cathode K.

In the region of a side 102 opposite to the first side 101, the semiconductor body 100 in the case of the thyristor has a p-type doping 42, which forms the p-type base of the component. An n-type emitter zone 43 is arranged in said p-type base 42, said emitter zone being contact-connected by a second metallization 47, which forms an emitter electrode. The n-type emitter 43 forms the main emitter of the thyristor and is interrupted by so-called emitter short circuits 47. In the region of these emitter short circuits, the p-type base reaches right up to the electrode 47. The component may be formed symmetrically with respect to an axis A-A in a lateral direction and may have a BOD structure (BOD—BreakOver Diode) in a so-called central region, said BOD structure being formed by virtue of the p-type base having highly curved sections in the central region. There may additionally be amplifying structures present between the BOD structure and the n-type main emitter 43, said amplifying structures each having an auxiliary emitter 44 embedded in the p-type base and an auxiliary electrode making contact with the auxiliary emitter 44 and the p-type base 42. These structures are also referred to as amplifying gate structures.

LIST OF REFERENCE SYMBOLS

11 First semiconductor zone, first stop zone section
12 Second semiconductor zone, second stop zone section
13 Semiconductor zone having basic doping, base zone
14 n-type emitter
15 p-type emitter
21, 22 Electrodes
31 p-type emitter
32 p-type base
33 n-type emitter
34 Gate electrode
35 Insulation layer, gate insulation
36, 37 Electrodes
41 p-type emitter
42 p-type base
43 n-type emitter
44 Auxiliary emitter
45 Section of the p-type base in the region of a BOD structure
46, 47 Electrodes
48 Gate electrode
100 Semiconductor body
101 First side, front side
102 Second side, rear side
111 First region of the semiconductor body
112 Second region of the semiconductor body
113 Protons in the first region of the semiconductor body
114 Defects in the second region of the semiconductor body
A Anode
A-A Axis
E Emitter
G Gate
K Cathode $x_0$ Vertical position
$N_{ref}$ Basic doping concentration
$N_D$ Doping concentration in the first or second stop zone

What is claimed is:

1. A semiconductor component, comprising:
   a semiconductor body having a first and second side,
   an emitter zone arranged in the region one of the sides,
   a stop zone of a first conduction type arranged at a distance from the emitter zone in a vertical direction of the semiconductor body,
   an intermediate zone of the first conduction type arranged between the stop zone and the emitter zone,
   a base zone of the first conduction type adjacent to the stop zone, said base zone being doped more weakly than the stop zone and the intermediate zone,
   wherein
   the doping concentration in the intermediate zone is greater than 5% of the maximum doping concentration in the stop zone and less than 50% of the maximum doping concentration in the stop zone.

2. The semiconductor component according to claim 1, wherein the doping concentration of the intermediate zone is more than twice as high as the doping concentration in the base zone.

3. The semiconductor component according to claim 1, wherein a distance between the stop zone and the one side is between 5% and 40% of the thickness of the semiconductor body.

4. The semiconductor component according to claim 3, wherein a distance between the stop zone and the one side is between 10% and 15% of the thickness of the semiconductor body.

5. The semiconductor component according to claim 1, wherein a dimensioning of the intermediate zone in a vertical direction of the semiconductor body is between 4% and 35% of the thickness of the semiconductor body.

6. The semiconductor component according to claim 1, wherein the stop zone and the intermediate zone have hydrogen-induced donors.

7. The semiconductor component according to claim 1, wherein the emitter zone is of the same conduction type as the stop zone and the intermediate zone.

8. The semiconductor component according to claim 1, wherein the emitter zone is doped complementarily to the stop zone and the intermediate zone.

* * * * *

UNITED STATES PATENT AND TRADEMARK OFFICE
CERTIFICATE OF CORRECTION

PATENT NO. : 7,667,297 B2  Page 1 of 1
APPLICATION NO. : 11/423026
DATED : February 23, 2010
INVENTOR(S) : Barthelmess et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 414 days.

Signed and Sealed this

Seventh Day of December, 2010

David J. Kappos
*Director of the United States Patent and Trademark Office*